United States Patent
Boyle

(10) Patent No.: US 6,275,054 B1
(45) Date of Patent: Aug. 14, 2001

(54) ELECTRICAL CONTACT SYSTEM

(75) Inventor: Stephen A. Boyle, Attleboro, MA (US)

(73) Assignee: Rika Electronics International, Inc., Attleboro, MA (US)

( * ) Notice: Subject to any disclaimer, the term of this patent is extended or adjusted under 35 U.S.C. 154(b) by 0 days.

(21) Appl. No.: 09/440,800

(22) Filed: Nov. 15, 1999

Related U.S. Application Data

(60) Provisional application No. 60/110,026, filed on Nov. 25, 1998.

(51) Int. Cl.$^7$ .................................................. H01R 13/24
(52) U.S. Cl. ................... 324/754; 324/158.1; 324/72.5; 439/482; 439/700
(58) Field of Search ................... 324/761, 158.1, 324/72.5, 754; 439/700, 482

(56) References Cited

U.S. PATENT DOCUMENTS

| | | |
|---|---|---|
| 2,480,963 | 9/1949 | Quinn . |
| 3,416,125 | 12/1968 | Theve . |
| 3,976,352 | 8/1976 | Spinner . |
| 4,012,105 * | 3/1977 | Biddle ................................. 339/183 |
| 4,138,643 | 2/1979 | Beck et al. . |
| 4,174,875 * | 11/1979 | Wilson et al. ......................... 339/91 |
| 4,245,189 | 1/1981 | Wahl et al. . |
| 4,397,519 | 8/1983 | Cooney . |
| 4,734,046 * | 3/1988 | McAllister et al. ................. 439/482 |
| 4,740,746 | 4/1988 | Pollock . |
| 5,175,493 | 12/1992 | Langgard . |
| 5,291,129 | 3/1994 | Kazama . |
| 5,576,631 | 11/1996 | Stowers et al. . |
| 5,850,147 * | 12/1998 | Stowers et al. ...................... 324/761 |
| 5,936,421 * | 8/1999 | Stower et al. ....................... 324/761 |
| 6,034,532 * | 3/2000 | Tarzwell ............................. 324/761 |
| 6,053,777 * | 4/2000 | Boyle ................................. 439/700 |

* cited by examiner

*Primary Examiner*—Safet Metjahic
*Assistant Examiner*—Jimmy Nguyen
(74) *Attorney, Agent, or Firm*—John A. Haug

(57) ABSTRACT

A coaxial contact assembly (100,100',100") is shown in which the outer cylindrical barrel (102,102',102''') is adapted to be fixedly mounted in a support and with a ground plunger (104,104") telescopically and slidably received therein and with an interface ductor member (106,106") in turn telescopically and slidably received within the bore of the ground plunger. The interface member is fixedly attached to and in electrical engagement with the braid layer of a coaxial cable (1) and is formed with a plurality of elongated, longitudinally extending fingers (106b) which extend radially outwardly a selected amount so that when received in the bore of the ground plunger they are biased into intimate electrical engagement therewith. An inverse electrical connection between the ductor member and the ground plunger is shown with fingers (104b') of ground plunger (104') biased into electrical engagement with a solid tubular inductor member (106b'). A dielectric spacer member (110,110') is mounted on the signal sleeve (16) and prevents electrical shorting between the interface ductor member (106,106") and the inner contact plunger (18). The inner, or signal, plunger (18) is maintained in coaxial relationship with the ground sleeve by means of a dielectric spacer member (108,108',108") mounted on the inner plunger (18). A coil spring (112,112") is disposed around the interface member for biasing the ground sleeve outwardly.

14 Claims, 5 Drawing Sheets

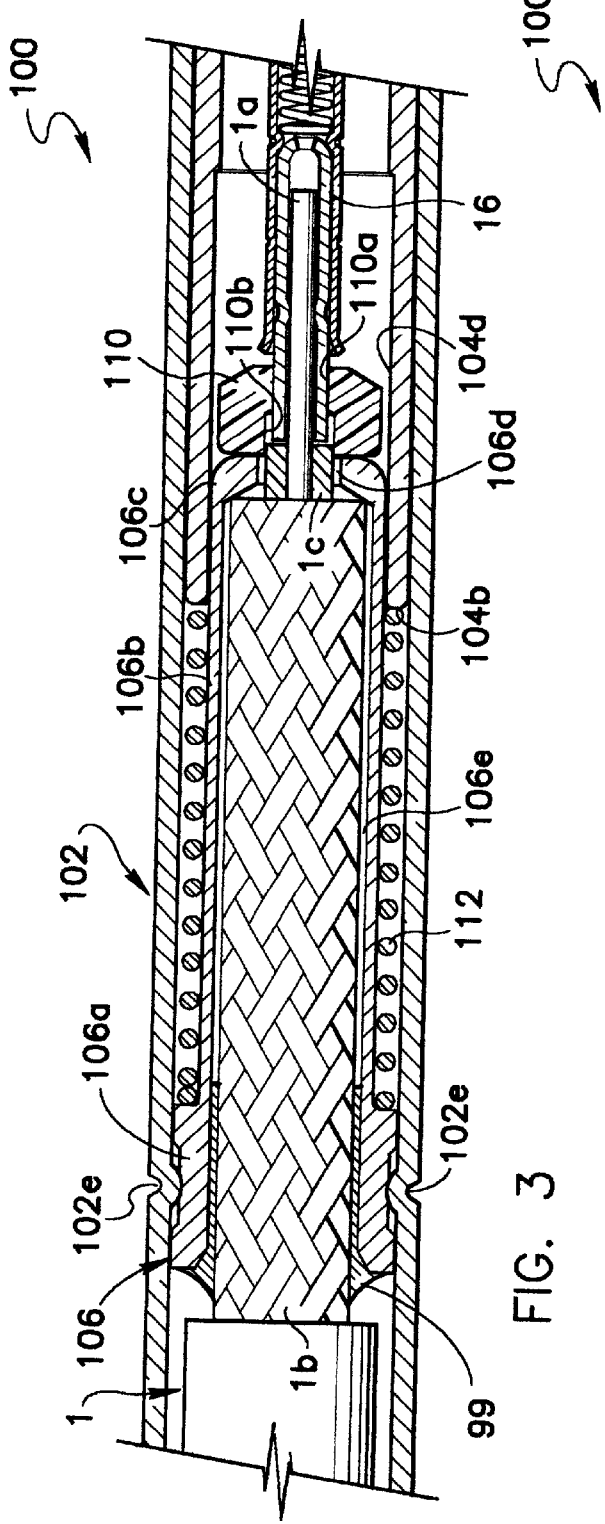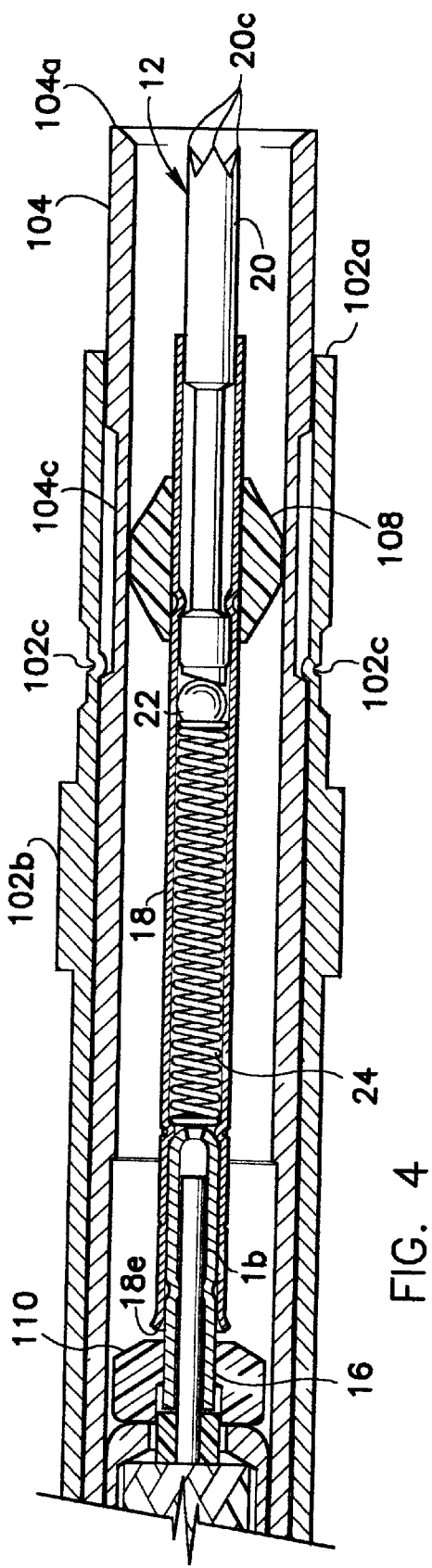
FIG. 3
FIG. 4

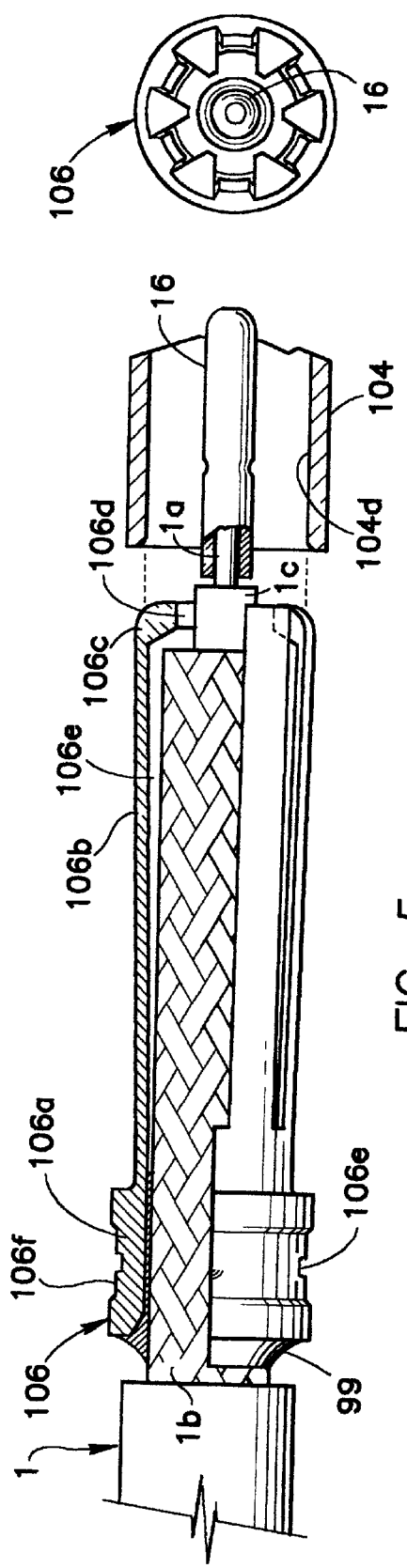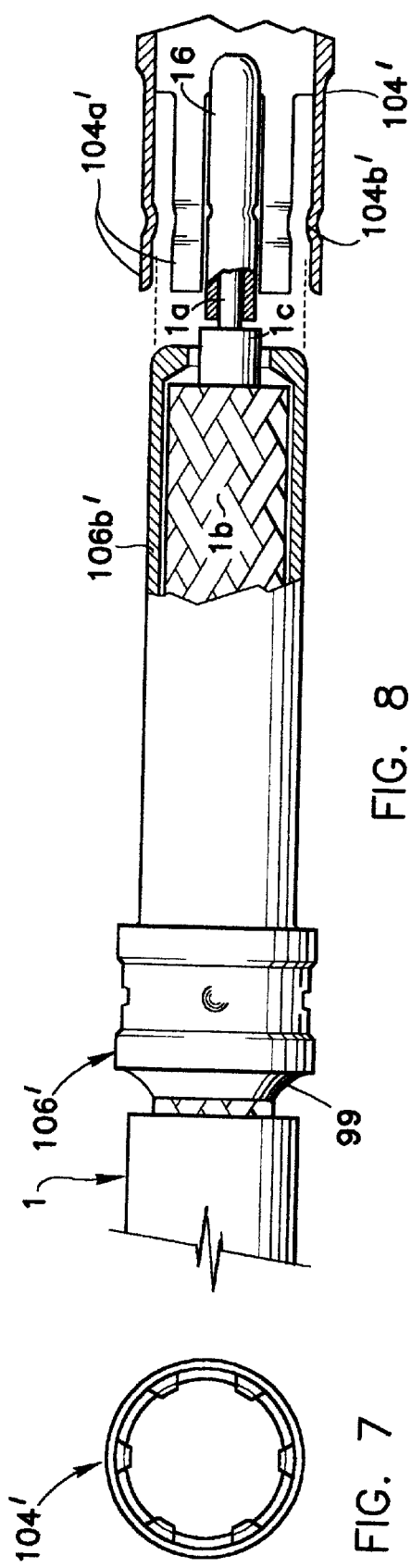

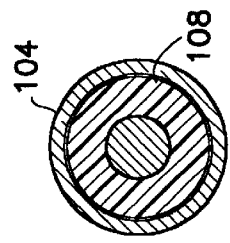
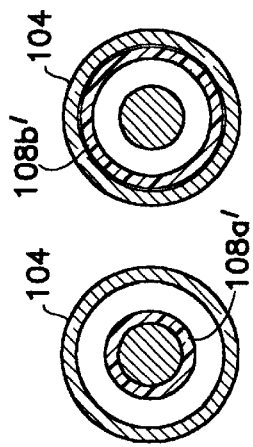
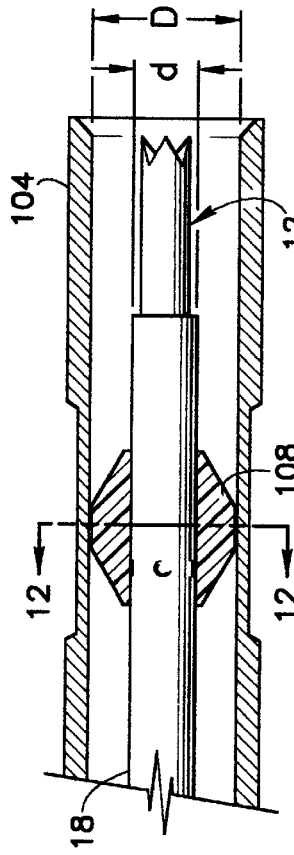
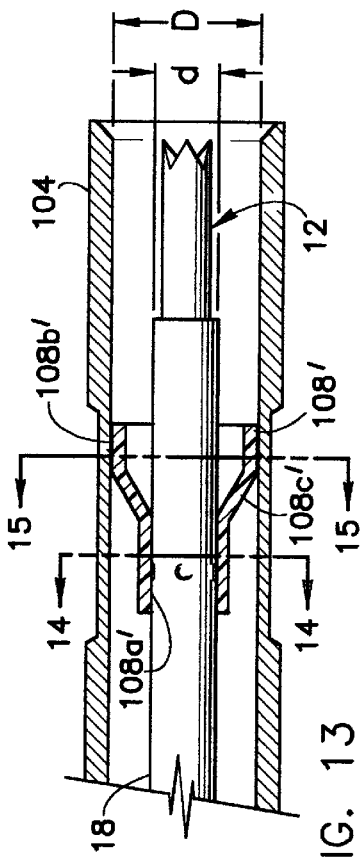
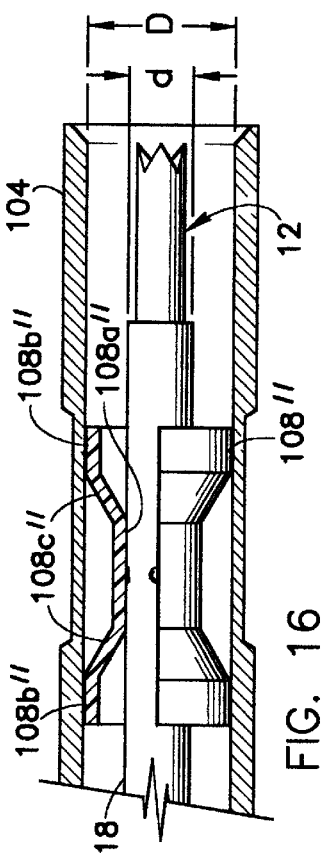

ELECTRICAL CONTACT SYSTEM

RELATED APPLICATIONS

Priority is claimed on Provisional Application 60/110,026, filed Nov. 25, 1998.

FIELD OF THE INVENTION

This invention relates generally to electrical contact systems and more particularly to spring biased contacts used, for example, to interconnect test apparatus, analyzers and the like to circuit boards and the like to be tested.

BACKGROUND OF THE INVENTION

Electrical contact systems having spring loaded, movable contacts are employed in circuit board and electronic circuit test systems and the like in which electrical contact is made between a circuit or device and one or more test points. The electrical contact system generally comprises a metal barrel having a contact plunger telescopically slidable therein and a spring disposed within the barrel for biasing the contact plunger to a normally outward position. The contact plunger has an outer end provided with a probe tip of a selected configuration to engage a test pad or the like of a circuit board or other device. As test systems employ higher radio frequencies in testing procedures there is an increasing need to provide the shortest possible so-called electrical path in a matched impedance system. Contact assemblies have moving parts and inherently have a degree of mismatch within the manufacturing tolerances and materials employed. Any mismatches which do occur are directly related to the length of the contact assemblies so that the longer the assembly, the greater the mismatch. In copending U.S. application Ser. No. 09/145,914, now Pat. No. 6,053,777 which issued Apr. 25, 2000 and is assigned to the assignee of the present invention, the subject matter of which is incorporated herein by this reference, an electric contact assembly having an improved short length is described accomplished, inter alia, by attaching the ground plunger to the coaxial cable. The system has an inner contact assembly having an electrically conductive inner plunger barrel received on the signal conductor of the coaxial cable and spaced from the ground plunger in coaxial relationship therewith. An inner contact portion of an inner plunger of the contact assembly is received in the plunger barrel and biased by a first spring to extend a selected amount in a given direction beyond the ground plunger when in at rest position and a second spring biasing the ground plunger and coaxial cable in the given direction with the second spring having a spring force greater than the first spring. In operation, the inner contact portion which extends outwardly beyond the ground plunger and outer contact portion will engage the test site and be forced inwardly until it is coplanar with the outer contact portion of the ground plunger. Both contact portions, as well as the coaxial cable, will then move inwardly together for another selected distance to ensure that predicatable contact pressure is obtained for both the inner and outer contact portions. By combining the motion of the inner and the outer contact portions, the overall length of the assembly is shortened thereby minimizing any impedance mismatch. However in certain applications, it is preferred to mount the coaxial cable so that it is immovable relative to the test fixture.

The ground plunger and the inner contact assembly of the electrical assembly described in Ser. No. 09/145,914 are maintained in concentric, coaxial relation with one another using first and second spaced apart annular spacer members of dielectric material so that the effective dielectric therebetween approximates that of air. In a modified embodiment, the spacer members are formed into an integral structure with a reduced diameter intermediate web joining two spacer portions, the reduced diameter web providing an open annular space with a resulting near air dielectric.

SUMMARY OF THE INVENTION

It is an object of the present invention to provide electrical contact apparatus for interconnecting test apparatus and the like with contact pads of a circuit board or other electrical device to be tested with a device having positive contact pressure which provides an improved short and direct electrical path. Another object of the invention is the provision of a coaxial contact assembly of the type described above in relation to Ser. No. 09/145,914 having an improved impedance matching for particular use with radio frequency electrical signals and the like yet one which includes a ground plunger which is movable relative to the coaxial cable. Another object is the provision of an improved electrical coaxial contact system having improved impedance matching for use with high frequency electrical signals which is relatively low in cost yet highly reliable, creating minimal electrical noise. Yet another object of the invention is the provision of a coaxial contact system having improved dielectric spacers to maintain the inner and outer contact assemblies in concentric, coaxial relationship with one another.

Briefly, an electrical contact system made in accordance with a first embodiment of the invention comprises a ground plunger barrel in which is telescopically, slidably received an electrically conductive, generally cylindrical interface ductor member having a hub portion from which a plurality of longitudinally extending fingers are formed, preferably with radially inwardly extending portions at their free distal ends and spaced from one another to form an opening. The hub is fixed to the ground conductor of a coaxial cable with the fingers received in the bore of the ground plunger barrel and biased into firm electrical engagement therewith. The electrically insulated signal conductor extends through the opening formed by the distal end of the fingers. The fingers are electrically isolated from an inner contact plunger mounted on a signal sleeve in turn disposed on the end of the signal conductor of the coaxial cable by an electrically insulative, generally annular, separator member. A dielectric spacer is fixedly mounted on the inner contact plunger barrel adjacent to the outer end of the ground plunger to maintain a coaxial relationship between the inner contact plunger and the ground plunger barrel. The ground plunger barrel is biased to a normally outward position by a coil spring received about the interface member and extending between the hub of the interface member and the inner end of the ground plunger barrel. The several parts are received in a fixed outer barrel and fixed thereto by means of crimping through the hub of the interface member.

According to a modified embodiment, the inner end of the ground plunger is formed with resilient fingers while the interface ductor member is a solid tubular member, i.e., it has no fingers. In yet another embodiment, a reduced diameter portion of the ductor member is received on the inner dielectric layer of the coaxial cable providing a space for the ground plunger spring to thereby enable a reduced diameter contact system. In other embodiments, dielectric spacers used to maintain the inner and outer contact assemblies in concentric, coaxial relation to one another are formed of a relatively thin tube of dielectric material which extends from a first diameter portion received on the inner contact assembly to a second diameter portion received within the ground plunger with the ratio of air to solid dielectric between the first and second diameters remaining substantially constant along the axial length of the spacer.

BRIEF DESCRIPTION OF THE DRAWINGS

Other objects, advantages and details of the novel and improved coaxial contact-assembly of the invention appear in the following detailed description of preferred embodiments of the invention, the detailed description referring to the drawings in which:

FIGS. 3 and 4 together show the FIG. 1 structure but are englarged for purpose of illustration and to facilitate the placement of reference characters;

FIG. 5 is a partial cross sectioned front elevational view of an interface ductor member used in the FIG. 1 embodiment in an intermediate phase of the assembly of the contact system;

FIG. 6 is an end view of FIG. 5 shown without the ground plunger;

FIG. 8 is a front elevational view of a modification of the FIGS. 5,6 structure and FIG. 7 is an end view thereof, again without the ground plunger;

FIG. 11 is a broken-off enlarged longitudinal cross sectional view of a portion of the ground plunger and dielectric spacer shown in FIG. 2;

FIG. 12 is a cross section taken on lines 12—12 of FIG. 11;

FIG. 13 is similar to FIG. 11 but showing a modified dielectric spacer;

FIGS. 14 and 15 are cross sections taken on lines 14—14 and 15—15, respectively, of FIG. 13; and FIG. 16 is a view similar to FIG. 11 but showing another modified dielectric spacer.

DESCRIPTION OF PREFERRED EMBODIMENTS

Figure 1:
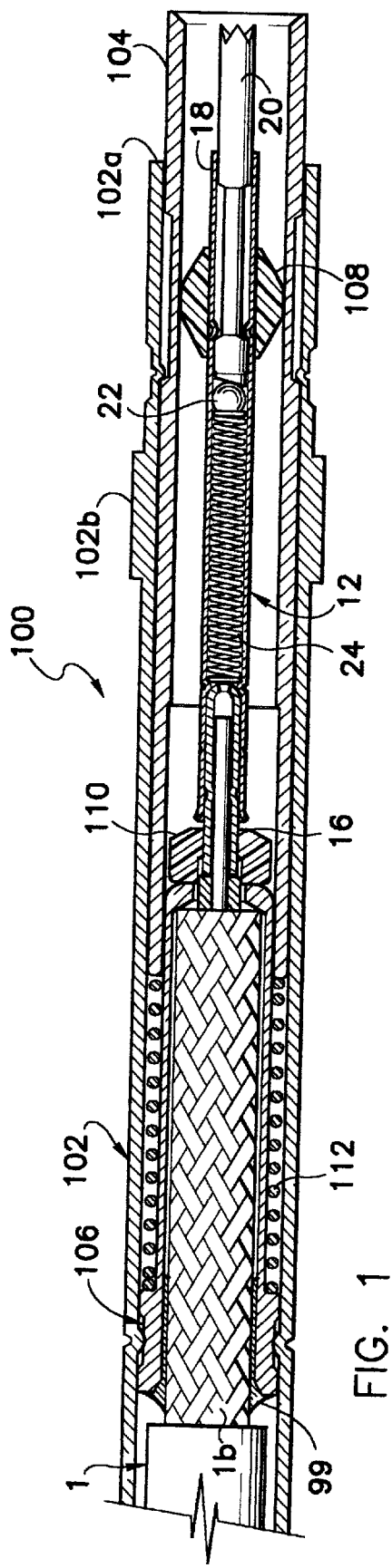
FIG. 1 is a longitudinal cross sectional view of a coaxial contact probe assembly made in accordance with a first preferred embodiment of the invention shown with a ground plunger in an extended, at rest, position.
Figure 2:
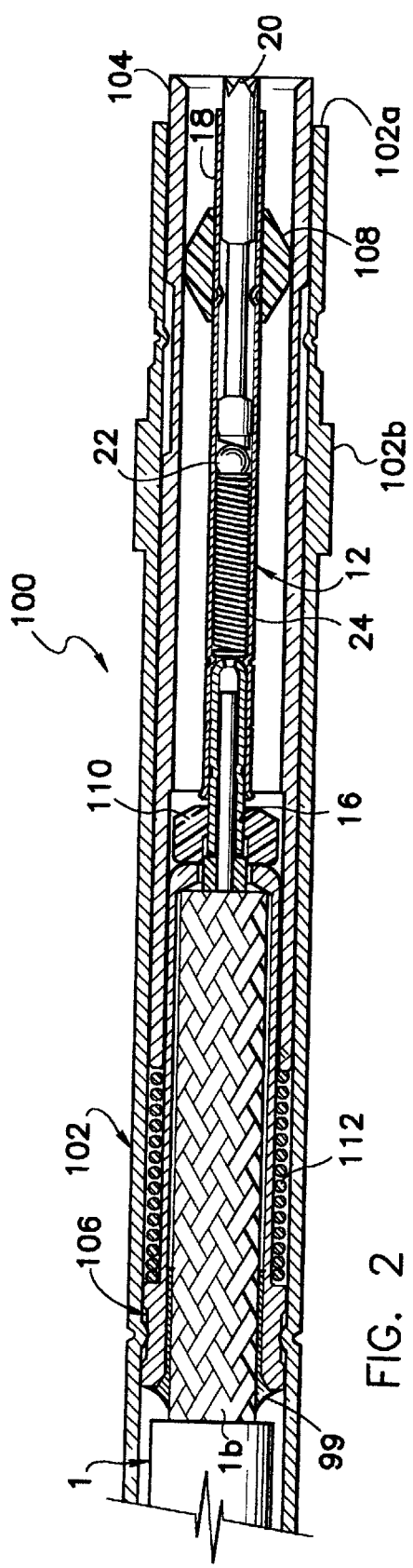
FIG. 2 is similar to FIG. 1 but shown with the ground plunger and inner contact in a retracted position, as used in operation.

With reference to FIGS. 1–4, a coaxial contact assembly 100 made in accordance with a first embodiment of the invention comprises an elongated cylindrical barrel 102 having an open end 102a and formed with a collar 102b to facilitate referenced mounting in an aperture in a support (not shown). A generally cylindrical, tubular ground plunger 104 is telescopically received for sliding movement within the bore of barrel 102. Ground plunger 104 is formed with suitable contact projection(s) 104a at one end and a spring reaction end surface 104b (FIG. 3) at an opposite end. A reduced diameter portion 104c is formed in the outer surface of ground plunger 104 in barrel 102 which serves to limit movement of ground plunger 104 in barrel 102. As shown in FIG. 4; dimples 102c limit movement between two opposite extremities, i.e., outward movement of ground plunger 104 as seen in FIG. 4, while FIG. 2 shows the ground plunger intermediate to its two extremities.

An interface ductor member 106, best seen in FIGS. 5 and 6, formed of suitable material such as gold plated hardened beryllium copper, comprises an annular hub portion 106a adapted for receipt on braid 1b of coaxial cable 1 in electrical connection therewith, preferably using a solder connection 99, or the like, to form a redundant electrical connection and to integrate the ductor member and the coaxial cable. Interface ductor member 106 is provided with a plurality of axially extending fingers 106b each having a radially inwardly extending distal end portion 106c which form an opening 106d at their distal end for reception of signal wire 1a and dielectric layer 1c surrounding the signal wire. Fingers 106b are preferably formed with a slight radial space 106e (see FIG. 3) between the fingers and braid 1b to allow a degree of radial movement of the fingers. Fingers 106b are formed to extend radially outwardly a slight amount to form an interference fit in bore 104d and extend into bore 104d in sliding electrical engagement. Interface ductor member 106 is shown with six fingers however the particular number employed is a matter of choice as long as a redundant, sliding electrical contact having positive contact pressure is obtained between ground plunger 104 and interface member 106. As shown in the drawings, solder 99 extends longitudinally along braid 1b and ductor member 106 to a location short of fingers 106b to avoid adversely affecting their flexibility. A cylindrical signal sleeve 16 is received on signal wire 1a in the same manner as shown and discussed in copending application Ser. No. 09/145,914. Signal sleeve 16 is in turn received in inner contact plunger barrel 18, also shown and discussed in the above referenced application. A redundant electrical connection can be provided by soldering signal sleeve 16 to signal wire 1a, if desired. Spacer member 108 formed of suitable dielectric material such as polytetrafluoroethylene, is similar to the outer spacer member 34 of the above referenced application except that member 108 is fixed to inner contact plunger 18 and is adapted to slide relative to ground plunger 104 while maintaining a coaxial relationship between the ground plunger and the inner contact plunger.

Interface ductor member 106 can be fabricated by cutting longitudinally extending slots in tubular member 106 thereby forming a plurality of fingers 106b as seen in FIGS. 5,6. Fingers 106b are then bent radially outwardly a slight amount as shown in the figures to provide the desired contact pressure when mounted in the bore of ground plunger 104.

Spacer or separator member 110 formed of suitable dielectric material, such as the same as that used for spacer member 108, has a first bore 110a (FIG. 3) which closely receives the dielectric layer 1c of coaxial cable 1. Spacer member 110 serves to help guide ground sleeve 104 onto cable 1 and interface member 106, to be discussed below, as well as to prevent electrical shorting of the inner contact plunger 18 and interface member 106. End portion 18e (FIG. 4) of inner contact plunger 18 can be flared to facilitate achieving the electrical separation.

Interface ductor member 106 is formed with a reduced diameter portion 106f intermediate to the opposite ends of hub 106a to facilitate fixing of the probe assembly within barrel 102 by crimping. Coil spring 112 is received around fingers 106b between hub 106a and end surface 104b of the ground plunger, the spring biasing the ground plunger to its outer position shown in FIG. 1.

In assembling the probe the cable, stripped with a portion 1b of the ground braid exposed, a portion of dielectric layer 1c exposed and a portion of signal wire 1a exposed and with signal wire sleeve 16 mounted on the end of signal wire 1a as shown in FIG. 3, is inserted into interface ductor member 106 with the braid portion bottoming out against end portions 106c and with portions 1c and 1a extending through opening 106d. The braid and interface member 106 are heated and solder 99 applied to solder the hub portion 106a to the braid. Spacer member 110 is then slid on and spring 112 placed over fingers 106b. Ground sleeve 104 is then placed on the interface member followed by barrel 102, the positions adjusted and crimps 102c and 102e are made.

The outer barrel 102, ground plunger 104, interface member 106 are all made of suitable electrically conductive material such as gold plated beryllium copper or other copper alloy. Outer barrel 102 can be machined, as shown in FIG. 1 or it can be drawn as shown in FIG. 9 as 102" with collar 102b" formed in the side wall or, as shown in FIG. 10, barrel 102''' can be drawn with a separate collar 102b''' attached in any suitable manner as by spot welding, soldering, press fitting with a straight knurl or the like.

Interface ductor member 106 serves a number of functions. Interface ductor member 106 provides redundant positive electrical contact engagement through the interference fit between fingers 106b and the inner surface of bore 104d. The interface member converts the braid portion of the coaxial cable into a precise diameter component. The relative massive hub portion 106a provides an assembly point that minimizes cable deformation upon crimping and lastly the member maintains the coaxial relation of the cable and the contact assemblies.

A modification of the interface ductor member to ground plunger connection is shown in FIGS. 7,8 where flexible 104a' are formed on the inner end of ground plunger 104', six fingers being shown, but the particular number provided being a matter of choice. The fingers are bent radially inwardly slightly so that they form an interference fit when received on a solid tubular contact portion 106b' of ductor member 106'. Otherwise, the contact system is the same as described in the first embodiment and thus its description need not be repeated.

Figure 9:
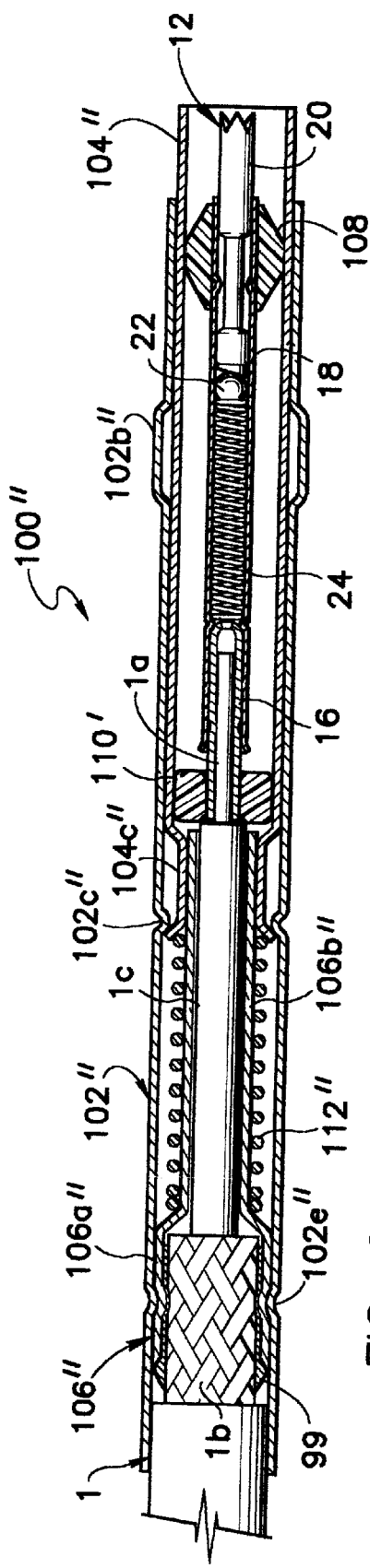
FIGS. 9 and 10 are longitudinal cross sectional views similar to FIG. 2 of modified embodiments of the coaxial contact system.
Figure 10:
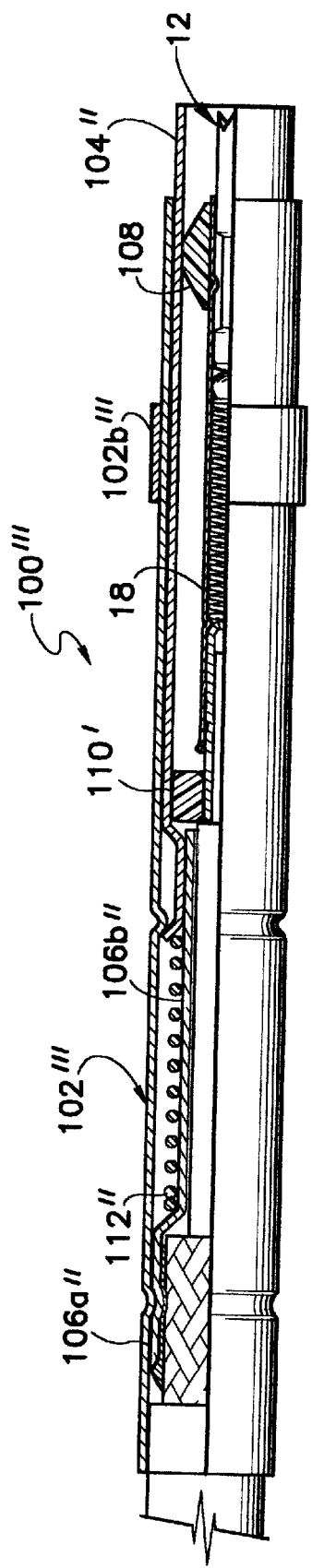

Going back to the embodiment shown in FIG. 9, interface ductor member 106" is shown as a drawn member having a hub portion 106" received on braid conductor 1b of the coaxial cable in the same manner as in the FIGS. 1–4 embodiment but is also provided with a reduced diameter portion 106b" which is received on an extended length portion of insulation layer 1c of coaxial cable 1. Ground plunger 104" has recessed portion 104c" formed at its inner end to cooperate with detent 102c" in limiting axial motion of the ground plunger as well as a seat for coil spring 112" having a smaller outside diameter than spring 112 of the first embodiment. The reduced diameter portion of the ductor member performs the function of the cable shield, which, along with the thin wall outer barrel 102" provides an improved impedance matching system. The ductor member/ground plunger connection of the FIG. 9 embodiment can also utilize the flexible finger configurations of FIGS. 5,6 or FIGS. 7,8, if desired.

With respect to FIG. 11, dielectric spacer member 108 of the FIG. 1 embodiment is shown having an inner diameter bore d received on inner contact plunger 18 and an outer diameter D received in the bore of ground plunger 104. As noted above, the function of spacer 108 is to maintain a concentric, coaxial relationship between the outside diameter of the inner contact plunger 18 and the inside diameter of the ground plunger 104. The ratio D to d and the dielectric constant of the dielectric material determines the characteristic imedance of the assembly. The d/D ratio of the assembly is calculated using air as the dielectric material except for the objects inserted within this volume of space, or "air zone". Any object inserted within the air zone will cause a different characteristic impedance, i.e., a mismatch. Spacer 108 minimizes the longitudinal length of the mismatch with the maximum mismatch occurring at the location of FIG. 12. FIG. 13 shows an improved spacer 108', also formed of suitable dielectric material, such as polytetrafluoroethylene, formed of a thin walled tubular member having a first small diameter, axially extending portion 108a' received on an inner contact plunger 18, diameter d, a second larger diameter, axially extending portion 108b' closely received in the bore of ground plunger 104, diameter D, and a tapered or intermediate, axially extending portion 108c'. This configuration allows the expansion of first portion 108a' to second portion 108b' without substantially changing the characteristic impedance, using a uniform wall thickness. Since the area of portion 108b' is somewhat larger than the area of portion a 108a', the thickness of the wall could be attenuated in the direction of increasing diameter to further minimize any mismatch, if desired.

FIG. 16 shows a variation of the FIG. 13 spacer combining two outer or second diameter portions 108b" with a common inner or first diameter portion 108a". The FIG. 16 embodiment can be used to eliminate use of a second spacer which otherwise may be needed in certain assemblies.

It will be understood that the invention includes all modifications and equivalents of the described embodiments falling within the scope of the appended claims.

What is claimed:

1. An electrical coaxial contact assembly for use with a coaxial cable having an inner signal conductor and an outer ground conductor comprising:

an electrically conductive inner contact assembly having a contact portion movable along a longitudinal axis and biased by a first spring in a given direction to a first extremity of the inner contact, the inner contact assembly being electrically connected to the inner signal conductor of the coaxial cable, an electrically conductive ground plunger having a contact portion and having a longitudinally extending bore, the ground plunger movable along the longitudinal axis and biased by a second spring in the given direction to a first extremity of the outer ground plunger, the inner contact assembly being disposed within the bore of the ground plunger and means to electrically separate the inner contact assembly and the ground plunger and to maintain them in coaxial relation to one another, an interface member for fixed mounting on the outer conductor of the coaxial cable received in the bore of the ground plunger and being in electrical engagement with the ground plunger, the second spring being mounted on the interface member and extending between the interface member and the ground plunger, one of the ground plunger and the interface member having a plurality of spring fingers biased into engagement with the other of the ground plunger and the interface member, the interface member and the ground sleeve disposed within an outer barrel, the interface member being fixedly attached to the outer barrel and the ground sleeve being slidable within the outer barrel.

2. An electrical coaxial contact assembly according to claim 1 further comprising a dielectric spacer member mounted between the interface member and the inner contact assembly.

3. An electrical coaxial contact assembly according to claim 1 in which the means to separate the inner contact assembly and the ground plunger comprises a dielectric spacer fixedly mounted on the inner contact assembly and slidable relative to the ground plunger.

4. An electrical coaxial contact assembly according to claim 1 in which a recessed area is formed in the outer surface of the ground plunger and projections extend inwardly from the outer barrel into the recessed area to limit motion of the ground plunger.

5. An electrical coaxial contact assembly according to claim 1 in which the interface member has a hub portion with a reduced external diameter intermediate to the ends thereof to facilitate crimping attachment of the outer barrel to the interface member and the interface member to the coaxial cable.

6. An electrical coaxial contact assembly according to claim 1 in which the spring fingers are formed on the interface member and radially inwardly extending stop portions are formed at the distal end of the fingers to serve as a reference location for the outer ground conductor of the coaxial cable.

7. An electrical coaxial contact assembly according to claim 1 in which the spring fingers are formed in the interface member.

8. An electrical coaxial contact assembly according to claim 7 in which the spring fingers extend in a direction along the longitudinal axis.

9. An electrical coaxial contact assembly according to claim 1 in which the spring fingers are formed in the ground plunger.

10. An electrical coaxial contact assembly according to claim 9 in which the spring fingers extend in a direction along the longitudinal axis.

11. An electrical coaxial contact assembly according to claim 2 in which the dielectric spacer member comprises a tubular wall having a uniform thickness with a first small diameter, axially extending portion joined to a second, larger diameter, axially extending portion through an intermediate, axially extending portion so that the ratio of solid dielectric spacer material to air remains substantially constant along the axial length portions.

12. An electrical coaxial contact assembly according to claim 11 in which the first axial length portion has two opposite ends and a second, larger diameter portion extends from each opposite end through an intermediate portion.

13. An electrical coaxial contact assembly for use with a coaxial cable having an inner signal conductor and an outer ground conductor comprising:

an electrically conductive inner contact assembly having a contact portion movable along a longitudinal axis and biased by a first spring in a given direction to a first extremity of the inner contact, the inner contact assembly being electrically connected to the inner signal conductor of the coaxial cable, an electrically conductive ground plunger having a contact portion and having a longitudinally extending bore, the ground plunger movable along the longitudinal axis and biased by a second spring in the given direction to a first extremity of the outer ground plunger, the inner contact assembly being disposed within the bore of the ground plunger and means to electrically separate the inner contact assembly and the ground plunger and to maintain them in coaxial relation to one another comprising a tubular wall having a uniform thickness with a first small diameter, axially extending portion joined to a second, larger diameter, axially extending portion through an intermediate, axially extending portion so that the ratio of solid dielectric spacer material to air remains substantially constant along the axial length portions, an interface member for fixed mounting on the outer conductor of the coaxial cable received in the bore of the ground plunger and being in electrical engagement with the ground plunger, the second spring being mounted on the interface member and extending between the interface member and the ground plunger, the interface member and the ground sleeve disposed within an outer barrel, the interface member being fixedly attached to the outer barrel and the ground sleeve being slidable within the outer barrel.

14. An electrical coaxial contact assembly according to claim 13 in which the first axial length portion has two opposite ends and a second, larger diameter portion extends from each opposite end through an intermediate portion.

* * * * *